US008625096B2

(12) United States Patent
Sewell et al.

(10) Patent No.: US 8,625,096 B2
(45) Date of Patent: Jan. 7, 2014

(54) METHOD AND SYSTEM FOR INCREASING ALIGNMENT TARGET CONTRAST

(75) Inventors: Harry Sewell, Ridgefield, CT (US); Mircea Dusa, Wezembeek-Oppem (BE); Richard Johannes Franciscus Van Haren, Waalre (NL); Manfred Gawein Tenner, Eindhoven (NL); Maya Angelova Doytcheva, Eindhoven (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 681 days.

(21) Appl. No.: 12/730,906

(22) Filed: Mar. 24, 2010

(65) Prior Publication Data

US 2011/0075238 A1    Mar. 31, 2011

Related U.S. Application Data

(60) Provisional application No. 61/168,382, filed on Apr. 10, 2009.

(51) Int. Cl.
*G01B 11/00*   (2006.01)
*H01L 23/544*  (2006.01)
*G03B 27/32*   (2006.01)
*G03F 9/00*    (2006.01)
*G03C 5/00*    (2006.01)
*H01L 21/76*   (2006.01)

(52) U.S. Cl.
USPC .............. 356/401; 257/797; 355/77; 430/22; 430/30; 438/401

(58) Field of Classification Search
None
See application file for complete search history.

(56) References Cited

U.S. PATENT DOCUMENTS

| 4,707,059 | A | * | 11/1987 | Ogura et al. ................. 385/7 |
| 5,838,450 | A | * | 11/1998 | McCoy et al. ............... 356/401 |
| 5,859,439 | A | * | 1/1999 | Nam et al. ................... 250/548 |
| 6,331,709 | B1 | * | 12/2001 | Amemiya et al. ......... 250/491.1 |
| 6,590,657 | B1 | * | 7/2003 | Summerer et al. ........... 356/401 |
| 6,605,816 | B2 | * | 8/2003 | Sandstrom ............... 250/492.22 |
| 6,780,775 | B2 | * | 8/2004 | Ning ............................ 438/706 |
| 7,264,169 | B2 | * | 9/2007 | Juds ............................. 235/468 |
| 7,972,017 | B2 | * | 7/2011 | Amako et al. ................. 353/98 |
| 8,115,938 | B2 | * | 2/2012 | Van Haren ................... 356/614 |
| 8,455,162 | B2 | * | 6/2013 | Gabor et al. ................... 430/22 |
| 2002/0182518 | A1 | * | 12/2002 | Van Haren ....................... 430/5 |

(Continued)

OTHER PUBLICATIONS

Du, Hai et al., "Technical and Software Note: PhotochemCAD: A Computer-Aided Design and Research Tool in Photochemistry," *Photochemistry and Photobiology*, American Society for Photobiology, vol. 68, No. 2, pp. 141-142, 1998.

Dixit, N.S et al., "Absorption and Emission Characteristics of Merocyanine 540 in Microemulsions," *Journal of the American Chemical Society*, vol. 105, No. 9, pp. 2928-2929, May 4, 1983.

(Continued)

*Primary Examiner* — Gordon J Stock, Jr.
(74) *Attorney, Agent, or Firm* — Sterne, Kessler, Goldstein & Fox P.L.L.C.

(57) ABSTRACT

A semiconductor wafer is aligned using a double patterning process. A first resist layer having a first optical characteristic is deposited and foams at least one alignment mark. The first resist layer is developed. A second resist layer having a second optical characteristic is deposited over the first resist layer. The combination of first and second resist layers and alignment mark has a characteristic such that radiation of a pre-determined wavelength incident on the alignment mark produces a first or higher order diffraction as a function of the first and second optical characteristics.

23 Claims, 11 Drawing Sheets

(56) References Cited

U.S. PATENT DOCUMENTS

| | | | |
|---|---|---|---|
| 2003/0081719 A1* | 5/2003 | Ida et al. | 378/34 |
| 2004/0043328 A1 | 3/2004 | Lu | |
| 2007/0077526 A1 | 4/2007 | Finders | |
| 2007/0287075 A1* | 12/2007 | Pforr et al. | 430/5 |
| 2008/0002213 A1* | 1/2008 | Weiss | 356/620 |
| 2008/0078741 A1* | 4/2008 | Kotani | 216/41 |
| 2010/0103433 A1* | 4/2010 | Ausschnitt | 356/630 |
| 2010/0301458 A1 | 12/2010 | Sewell et al. | |
| 2011/0019173 A1* | 1/2011 | Vladimirsky et al. | 355/67 |
| 2012/0021140 A1* | 1/2012 | Dijksman et al. | 427/595 |

OTHER PUBLICATIONS

Sims, Peter Jay et al., "Studies on the Mechanism by Which Cyanine Dyes Measure Membrane Potential in Red Blood Cells and Phosphatidylcholine Vesicles," *Biochemistry*, American Chemical Society, vol. 13, No. 16, pp. 3315-3330, Jul. 30, 1974.

Brokner-Christiansen, Mads et al., "Combined nanoimprint and photolithography of integrated polymer optics," IEEE/LEOS Summer Topical Meetings, Jul. 23-25, 2007, pp. 101-102.

Non-Final Rejection mailed Feb. 26, 2013 for U.S. Appl. No. 12/725,026, filed Mar. 16, 2010; 12 pages.

* cited by examiner

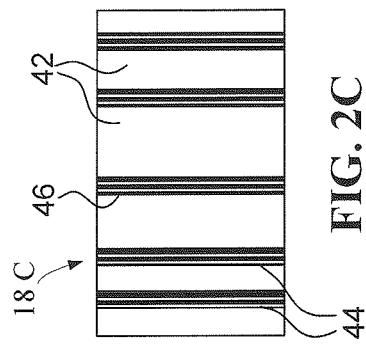
FIG. 2A
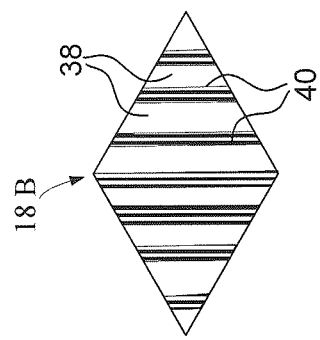
FIG. 2B
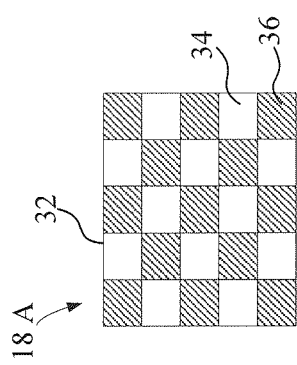
FIG. 2D
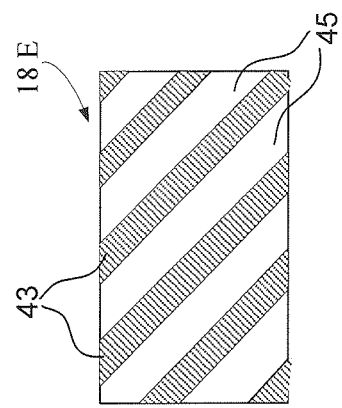
FIG. 2C
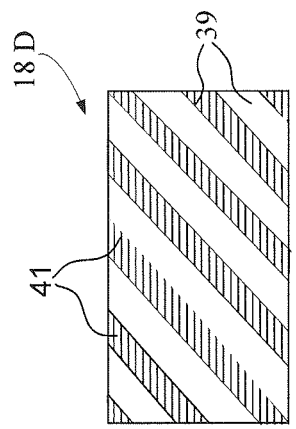
FIG. 2E
FIGs. 2A-2E

METHOD AND SYSTEM FOR INCREASING ALIGNMENT TARGET CONTRAST

CROSS REFERENCE TO RELATED APPLICATION

This application claims the benefit of provisional application 61/168,382 filed on Apr. 10, 2009. The subject matter of that application is incorporated herein by reference as if fully set forth herein.

BACKGROUND

1. Field of the Invention

The present invention relates generally to an illumination system of the type used in lithographic apparatus for semiconductor wafer manufacture.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging the pattern using a UV radiation beam onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

Lithography apparatus typically includes an alignment system that detects positions of alignment marks on a wafer and for aligning the wafer to ensure accurate exposure from a mask. In a double patterning process, a first resist layer having an alignment mark is coated with a second resist layer prior to etching the first and second resist layers. In double patterning systems, the alignment marks in the first resist layer are used to align a mask and expose the second resist layer. However, the alignment mark in the first resist layer may be obliterated or may provide poor contrast and weak diffraction orders when illuminated at an alignment wavelength since it is coated over with the second resist layer. Methods and systems are needed to overcome the above alignment deficiencies in double patterning systems.

SUMMARY

According to one embodiment of the present invention, there is provided a method to align a wafer in a double patterning process. A first resist layer having a first optical characteristic is deposited and forms at least one alignment mark having the first optical characteristic in the first resist layer. The first resist layer is developed. A second resist layer is deposited over the first resist layer. This second resist layer has a second optical characteristic. The combination of first and second resist layers and alignment mark is configured such that radiation of a pre-determined wavelength incident on the alignment mark produces a first or higher order diffraction as a function of the first and second resist layers' optical characteristics.

In an embodiment, the alignment mark in the first resist layer and a portion of the second resist layer together form a diffraction grating. The grating enhances first or higher order diffractions while substantially reducing $zero^{th}$ order diffraction and specular reflection when illuminated with the wavelength used for alignment.

The method further includes the step of infusing one or both of the first and second resist layers with a dye or a photoactive compound that absorbs, fluoresces or luminesces when illuminated with radiation of the pre-determined wavelength used for alignment. A photoactive compound/dye can be added to the first resist layer prior to depositing the first resist layer. The dye or photoactive compound may be added to the first resist layer while depositing the first resist layer. Alternatively, the dye or a photoactive compound can be added to the first resist layer after developing the first resist layer.

In another embodiment, the method comprises the step of freezing the first resist layer after the developing step and adding a photoactive compound to a freeze agent used to freeze the first resist layer.

In yet another embodiment, the dye or photoactive compound is added only to the second resist layer.

In another embodiment, the dye or photoactive compound is added to the first resist layer after patterning the first resist layer.

In a further embodiment, a first dye or photoactive compound is added to the first resist layer and a second photoactive compound or dye is added to the second resist layer so as to increase optical contrast between the first and second resist layers and to improve diffraction of radiation incident on the alignment mark in the first resist layer.

According to another embodiment of the present invention, an optical element is provided comprising, a first resist layer having a first optical characteristic and a second resist layer deposited over the first resist layer and having a second optical characteristic. An alignment mark formed by the combination of the first and second resist layers provides enhanced contrast when illuminated with a pre-determined wavelength used for alignment. In an embodiment, one or both of the first and the second resist layers is infused with a dye or photoactive compound that affects the resist layer's optical characteristics when illuminated with a wavelength used for alignment.

According to a further embodiment of the present invention, there is provided a lithographic apparatus comprising an illumination source configured to condition a radiation beam; and a reflective substrate, the substrate including alignment targets for aligning the substrate. The substrate includes a first resist layer having a first optical characteristic and a second resist layer deposited on top of the first resist layer and having a second optical characteristic. A grating formed by the combination of the first and second resist layers provides enhanced contrast when illuminated with a pre-determined wavelength used for alignment.

In an embodiment, one or both of the first and the second resist layers is infused with a dye or photoactive compound that affects the resist layer's optical characteristics when illuminated with a wavelength used for alignment.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 2A-E each show a plan view of an example of different possible alignment marks. In addition to those shown, other examples are possible.

Figure 1A:
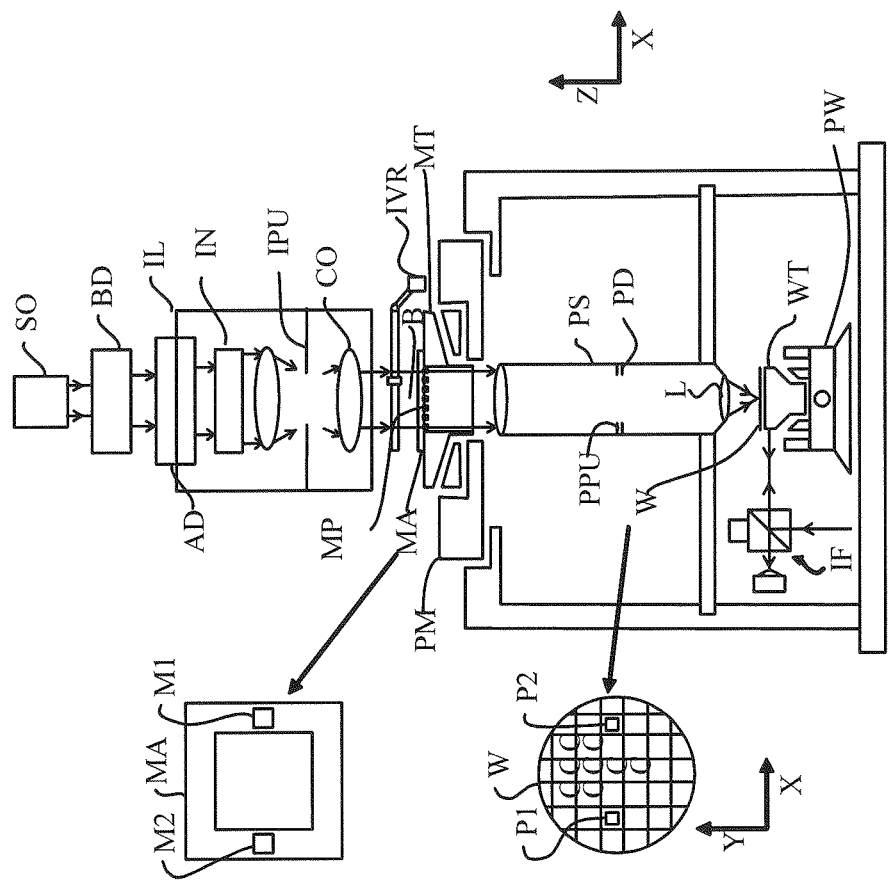
FIG. 1A depicts a lithographic apparatus, according the invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1A schematically depicts an embodiment of lithographic apparatus suitable for use with the invention. The apparatus comprises: an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

Further, in an interferometric lithographic system there is no patterning device, but rather a light beam is split into two beams, and the two beams are caused to interfere at a target portion of substrate through the use of a reflection system. The interference causes lines to be formed on at the target portion of the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus maybe of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device, in this case mask MA, in accordance with a pattern MP. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W maybe aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Mask table MT and patterning device MA can be in a vacuum chamber, where an in-vacuum robot IVR can be used to move patterning devices such as a mask, similar to patterning device MA, in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
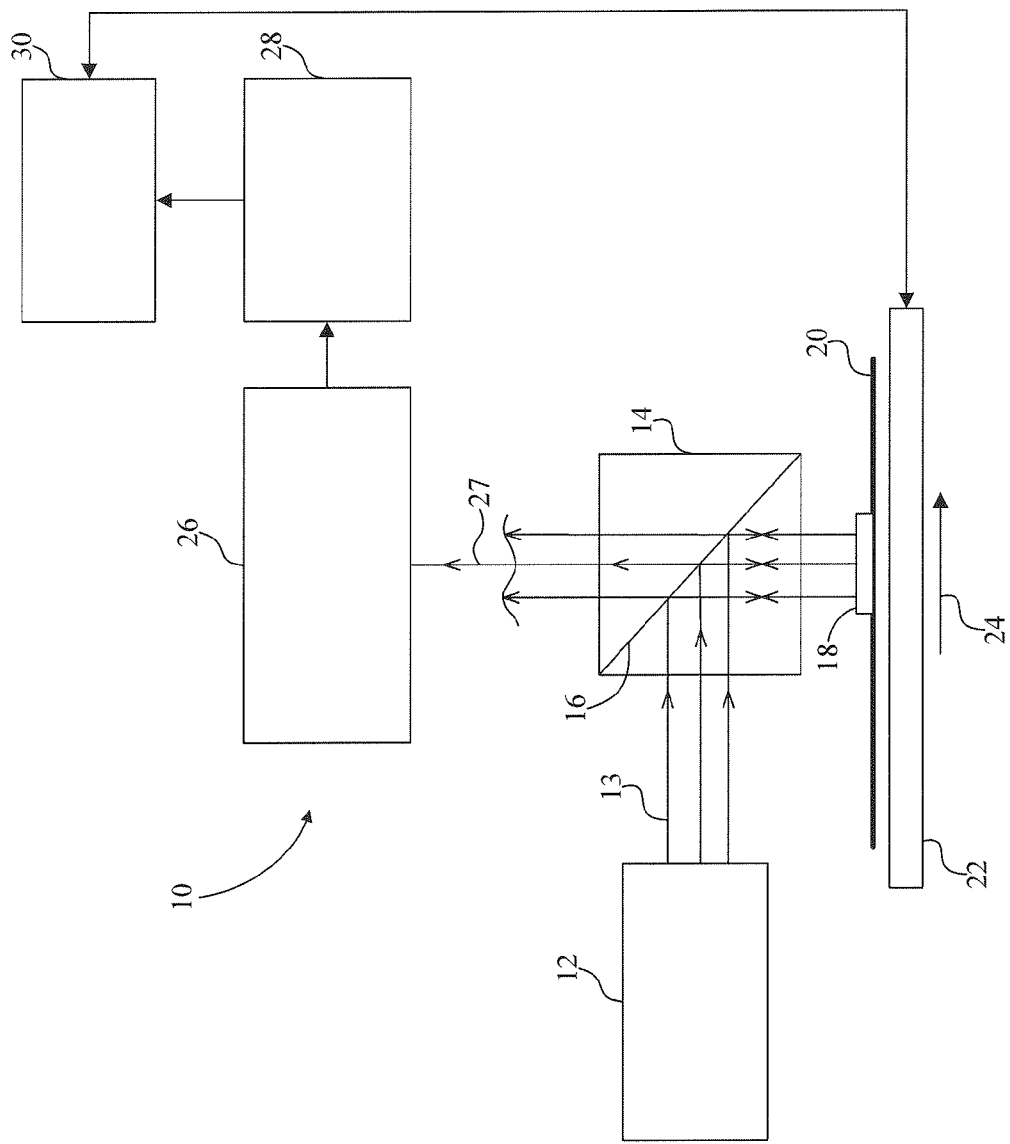
FIG. 1B is a schematic diagram illustrating an exemplary alignment system.

FIG. 1B is a schematic diagram illustrating an exemplary alignment system. Alignment system 10 may be part of the lithographic apparatus in FIG. 1A. Alignment sensor 10 comprises a coherent illumination source 12, such as a laser, providing electromagnetic radiation 13, to a beamsplitter 14. A portion of the electromagnetic radiation is reflected off coating 16 to illuminate an alignment mark or target 18. The alignment mark 18 is placed on or within a photosensitive substrate or wafer 20. The alignment mark or target 18 may have one hundred and eighty degree symmetry. By one hundred and eighty degree symmetry, it is meant that when the alignment mark or target 18 is rotated one hundred and eighty degree about an axis of symmetry perpendicular to the plane of the alignment mark 18, the alignment mark is substantially identical to the unrotated alignment mark. The axis for which this is true is called the axis of symmetry. In an embodiment, alignment mark 18 is a series of defined marks such as a chevron.

The alignment mark 18 is placed on or within a photosensitive substrate or wafer.

The photosensitive substrate is placed on a stage 22. The stage 22 may be scanned in the direction indicated by arrow 24. Electromagnetic radiation reflected from the alignment mark 18 passes through the beamsplitter 14 and is collected by the image rotation interferometer 26. It should be appreciated that a good quality image need not be formed, but that the features of the alignment mark should be resolved. The image rotation interferometer 26 may be any appropriate set of optical-elements, and is preferably a combination of prisms, that form two images of the alignment mark, rotate one of the images with respect to the other one hundred and eighty degrees and then recombines the two images interferometrically so that when aligned with the alignment target 18, the electromagnetic radiation will interfere either in a polarization sense or in an amplitude sense, constructively or destructively, making readily detectable the center of the alignment mark 18. The optical ray passing through the center of rotation established by the interferometer, 26, defines the sensor alignment axis 27. Detectors 28 receive the electromagnetic radiation from the image rotation interferometer 26. The detectors 28 then provide signals to the signal analyzer 30. The signal analyzer 30 is coupled to the stage 22 such that the position of the stage is known when the center of alignment mark 18 is determined. Therefore, the position of the alignment mark 18 is very accurately known with reference to the stage 22. Alternatively, the location of the alignment sensor 10 may be known such that the center of the alignment mark 18 is known with reference to the alignment sensor 10. Accordingly, the exact location of the center of the alignment target 18 is known relative to a reference position. Thereby, by using an alignment with an image rotation interferometer, the alignment system is self referencing to the center of the alignment mark.

FIGS. 2A-E are plan views of examples of different possible alignment marks. It should be appreciated that FIGS. 2A-E are only examples of different alignment marks and that many different alignment marks may be utilized that can readily be determined by one skilled in the art based on the teachings herein.

FIG. 2A illustrates a square grid checkerboard alignment target 18A. The target 18A is comprised of a plurality of two types of optically different squares, 34 and 36. The two types of squares may be differentiated by pattern, reflectance (amplitude and/or phase), or any combination of these. Alignment mark 18A functions primarily like two linear gratings oriented at right angles with respect to each other; one at an angle of +45 degrees with respect to the orientation of edge or line 32 and the other at an angle of +45 degrees with respect to edge or line 32.

FIG. 2B illustrates a diamond shaped alignment mark 18B. The alignment mark 18B is comprised of a plurality of vertical equally spaced lines 40 having spaces 38 there between.

FIG. 2C illustrates another alignment mark 18C. The alignment mark 18C has a plurality of lines 44 separated by spaces 42. The spaces 42 are of different spacing or dimensions. Therefore, the lines 44 have a different pitch or period. The different periods of lines 44 are symmetrical about a central line 46.

FIG. 2D illustrates another alignment target 18D. Alignment target 18D has alternating lines, which may be spaces 39 and lands 41. The spaces 39 and the lands 41 are angled forty-five degrees with respect to the longitudinal axis of the alignment target 18D.

FIG. 2E illustrates another alignment target 18E. Alignment target 18E has alternating lines, which may be spaces 45 and lands 43. The spaces 45 and the lands 43 are angled forty-five degrees with respect to the longitudinal axis of the alignment target 18E.

The signal detected from illuminated alignment marks 18 can be affected by how well the illumination wavelengths are matched to the physical, optical or chemical characteristics of the alignment marks 18, or physical, optical or chemical characteristics of materials in contact with or adjacent to the alignment marks 18. Since the aforementioned characteristics can vary depending on the lithographic process used, state of the art alignment systems may offer a set of discrete, relatively narrow band illumination wavelengths in order to maximize the quality and intensity of alignment mark signals detected by the alignment system. Improved alignment mark signals that carry accurate information about the position of the marks can enhance overlay performance of the lithographic tool. Alignment marks are placed in different configuration and locations on a wafer to aid in alignment of the wafer.

Figure 3:
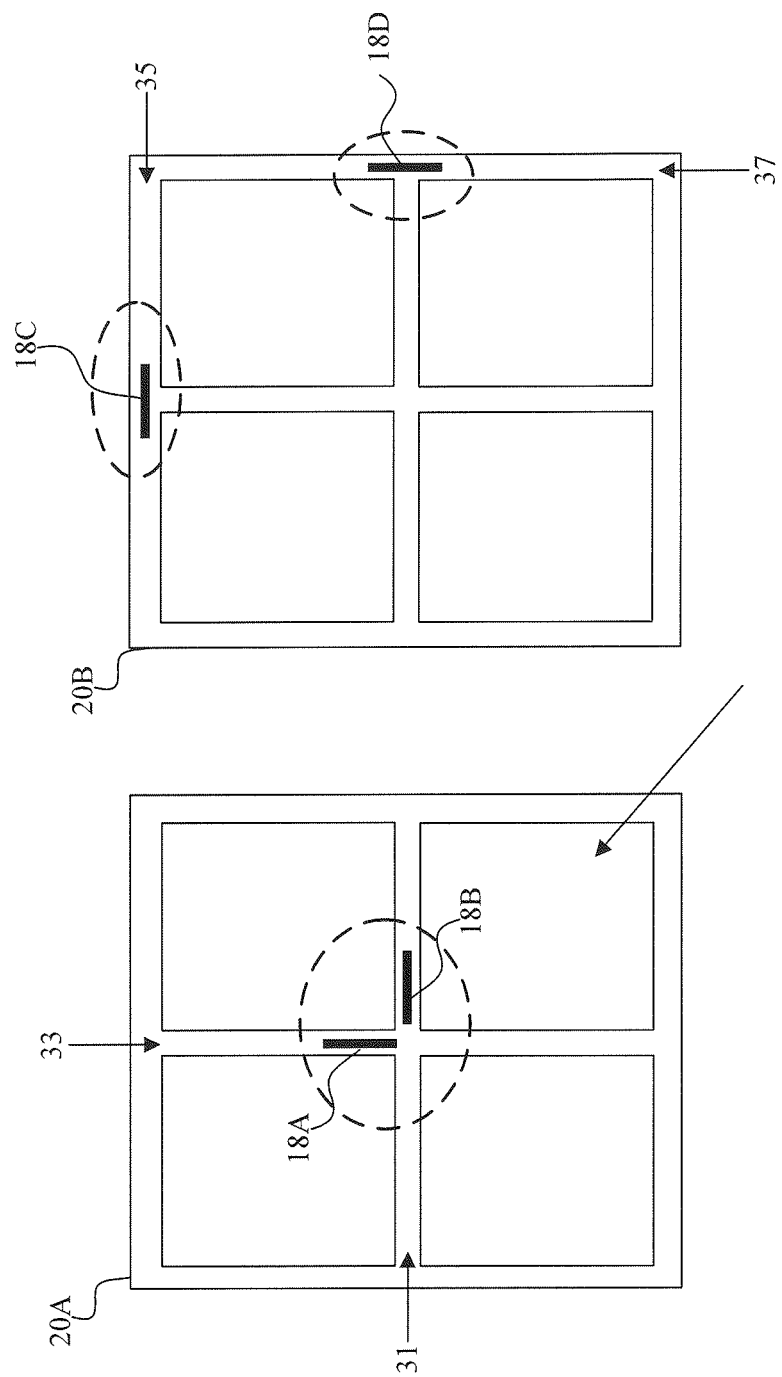
FIG. 3 illustrates example placement of alignment marks.

FIG. 3 illustrates example placement of alignment marks 18A-D. Fields 20A and 20B are part of a larger wafer (e.g. wafer W) and include 4 dies each. The dies are separated by inner scribe lances such as scribe lanes 31, 33 and outer scribe lanes such as scribe lanes 35 and 37. Alignment marks 18A and 18B are placed in inner scribe lanes 31 and 33 respectively. Alignment marks 18C and 18D are placed in outer scribe lanes 35 and 37 respectively. Alignment marks 18 are used to align wafers in double patterning processes as described below.

Figure 4:
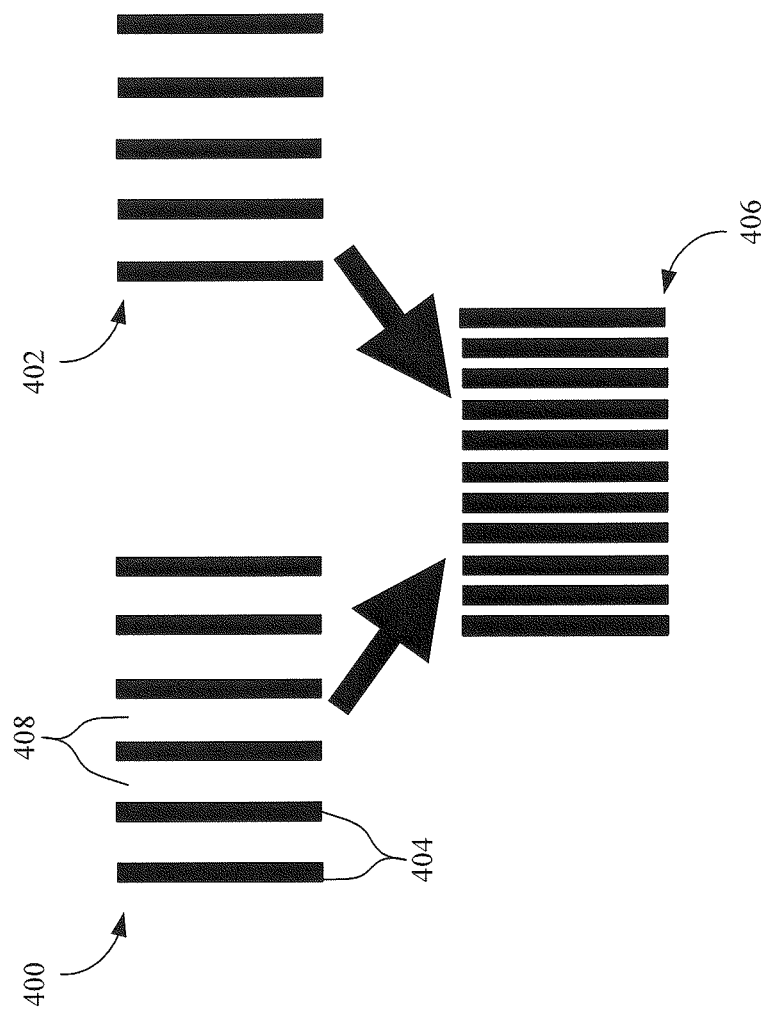
FIG. 4 illustrates an example pattern formed using a double patterning process.

In a double patterning process, resist lines are printed twice, the second print being interstitial on the first print. FIG. 4 illustrates an example of double patterning. Pattern 402 is interstitially patterned between the gaps 408 of resist lines 404 of pattern 400 so as to form double pattern 406. Double patterning allows for finer resolution lithography and greater utilization of available wafer area. A number of double patterning process sequences are available. For example, spacer; Lithography Etch Lithography Etch (LELE) and Lithography Process Lithography Etch (LPLE) processes may be used for double patterning. LPLE is more cost effective than LELE since a first etching process in LELE is not required in LPLE. A variant of LPLE is Litho Freeze Litho Etch (LFLE), that is described below.

Figure 5:
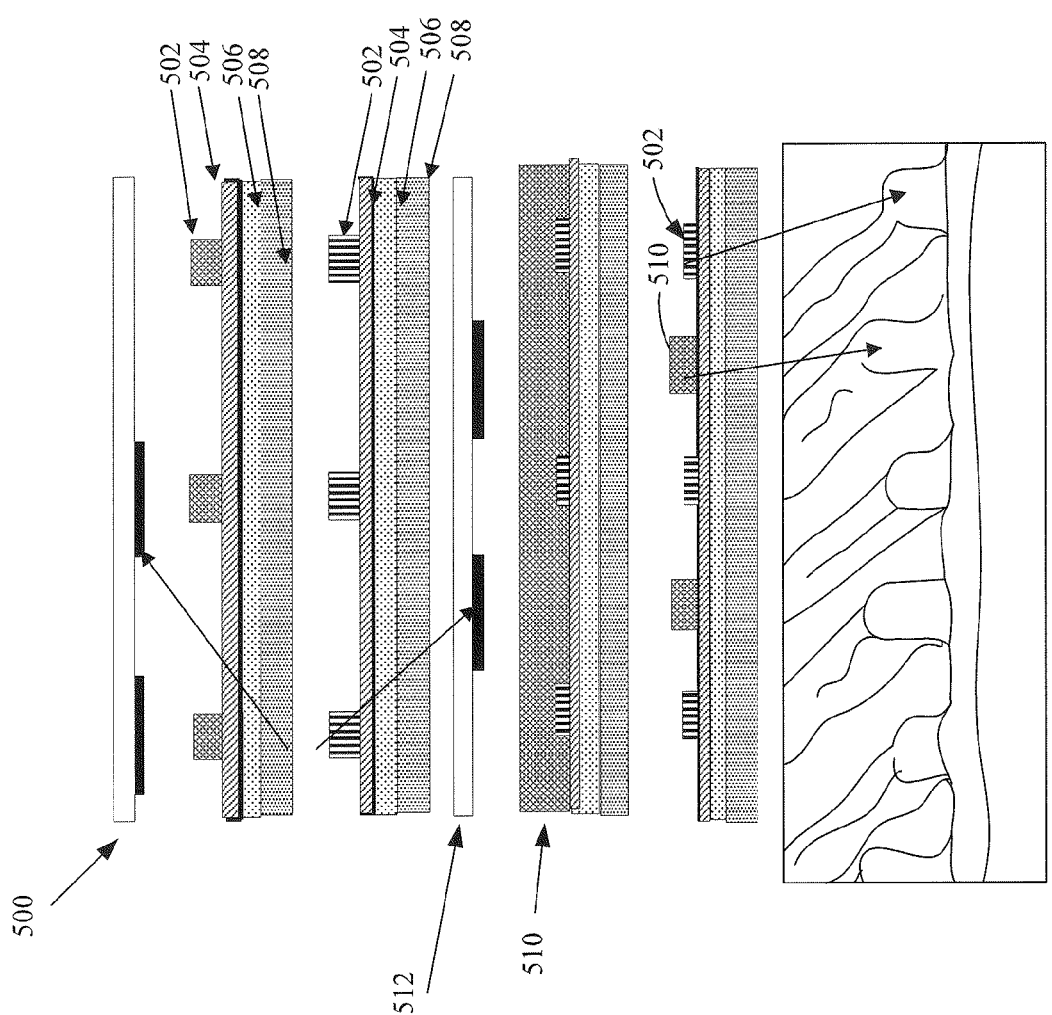
FIG. 5 illustrates an example of a double patterning process Litho Freeze Litho Etch (LFLE) process.

FIG. 5 illustrates example steps in a Litho Freeze Litho Etch (LFLE) process.

In step 1, a first pattern (including one or more alignment marks such as alignment mark 18) is defined in first resist layer 502 that is deposited on top of a layer of Bottom Anti-Reflective Coating (BARC) 504, polysilicon 506 and Silicon di-oxide SiO2 508. The first pattern may be defined using mask 500 that has a 1:1 line/space (L/S) ratio.

In step 2, first resist layer 502 is "frozen" or hardened by one or more of ion implantation, Deep Ultra-Violet (DUV) exposure, or chemical hardening.

In step 3, the first resist layer 502 is coated over with second resist layer 510 and patterned using mask 512. Mask 512 is aligned using alignment marks 18 in first resist layer 502. Mask 512 may also have a 1:1 line/space (L/S) ratio.

In step 4, the second resist layer 510 is developed.

In step 5, polysilicon layer 506 is etched.

Figure 6:
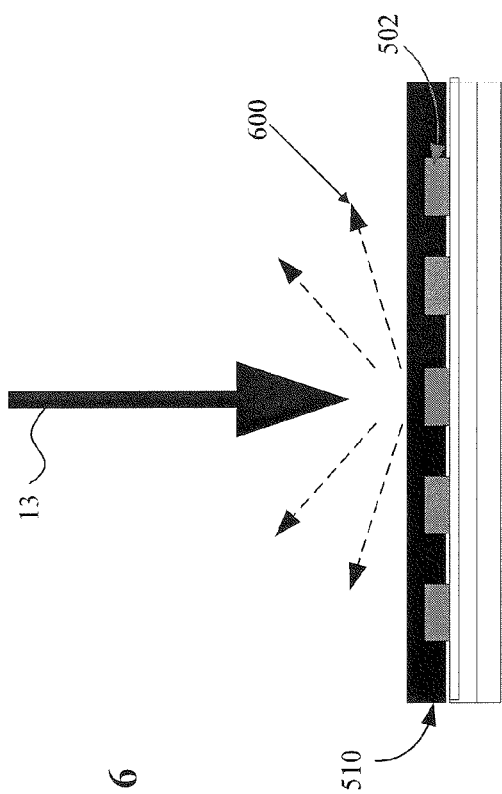
FIG. 6 illustrates weak diffraction orders from an alignment mark in a first resist layer.

One problem in double patterning techniques such as the one described above is that of alignment using the alignment mark 18 in first resist layer 502 when it is coated over with the second resist layer 510. The alignment mark 18 defined in first resist layer 502 may be obliterated, with respect to contrast provided when illuminated with an alignment wavelength, when coated over with resist 510 that has the same or similar optical properties as resist used in resist layer 502. Therefore, the alignment mark 18 in the first resist layer 502 cannot be imaged by the alignment system 10. This forces conventional alignment systems to use an alignment mark defined by in previous processing step (i.e. an alignment mark that is lower in an alignment mark stack) for alignment of mask 512 with the first resist layer 502. For example, in step 3, an alignment mark 18 in the first resist layer 502 may be obliterated or may provide poor contrast and weak diffraction orders 600 (see FIG. 6) when illuminated with radiation 13 of an alignment wavelength used to align mask 512 with the first resist layer 502. This is because the alignment mark 18 in first resist layer 502 is coated over with the second resist layer 510.

Figure 7:
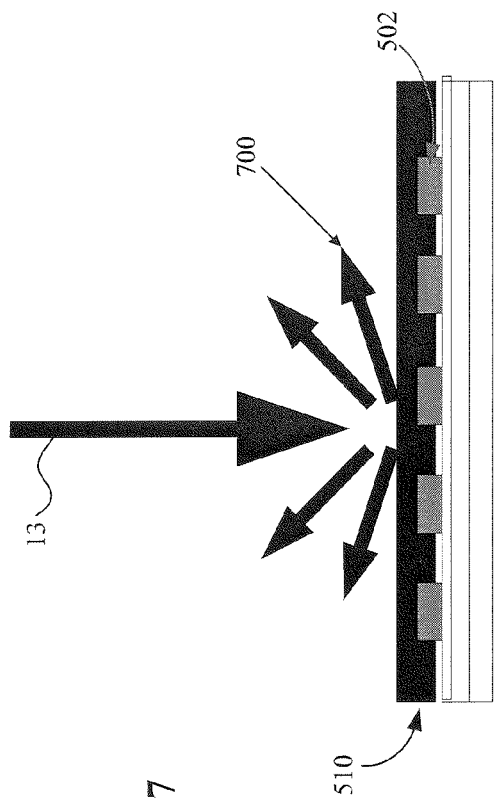
FIG. 7 illustrates strong diffraction orders from an alignment mark in a first resist layer.

Embodiments presented herein provide means of highlighting the definition of the patterned alignment mark 18 in the first resist layer 502, even when the alignment mark 18 is coated over with second resist layer 510. These embodiments enable more accurate alignment of a wafer by increasing the contrast of the alignment mark 18 in the first resist layer 502 when illuminated with radiation of a predetermined wavelength that is used for alignment. Accordingly, a photoactive compound or dye is added before, mixed together with, or added after the first resist layer 502 is deposited. The dye or photoactive compound is selected such that it does not interfere with the first resist layers' actinic properties or the ability to freeze the first resist layer 502 in step 2. The dye or the photoactive compound is configured to change the optical characteristics of the first resist layer so as to generate first or higher order diffractions 700 (see FIG. 7) and provide a strong, high contrast alignment signal when illuminated with radiation 13 of a predetermined alignment wavelength. Alternatively, the dye or photoactive compound may cause the alignment mark to fluoresce or be luminescent when exposed with a predetermined wavelength used for alignment.

In an embodiment, the first resist layer 502 and the second resist layer 510 may combine to form a diffraction grating that is detectable by the alignment system 10. Reflected diffraction orders may be created by the grating formed by the dyed resist image in resist layer 502 interspaced with un-dyed resist layer 510. According to an embodiment of the invention, the combination of first and second resist layers and alignment mark is configured such that radiation 13 of a pre-determined wavelength incident on the alignment mark produces a first or higher order diffraction 700 (see FIG. 7) as a function of the first and second optical characteristics or first resist layer 502 and second resist layer 510 respectively. In an embodiment, based on respective first and second optical characteristics of the respective first resist layer 502 and second resist layer 510 an alignment mark in the first resist layer exhibits high contrast and/or high order diffraction when illuminated with radiation 13 of a predetermined wavelength. The optical characteristics of the first and second resist layer are derived from a dye or a photoactive compound added to them as described below. If no dye is added to the first or second resist layer then they have the optical characteristic of a native resist solution used to create the layers.

In an embodiment, the dye or photoactive compound may be added to first resist layer 502 before or after developing the first resist layer 502. A pattern such as an alignment mark 18 in the first layer of resist may be frozen by the utilization of a spin-coated freezing material. In an embodiment, the freezing material can be modified such that, apart from freezing, it simultaneously provides the first layer resist 502 with the dye or photoactive compound to provide high contrast diffractions at an alignment system wavelength. Examples of alignment wavelengths including but not limited to may be 532 nm, 635 nm, 780 nm, and 850 nm. In yet another embodiment, the dye can be added to the a liquid resist solution used to form first resist layer 502, before it is applied to BARC 504, or during the application of the resist solution onto BARC 504. In a further embodiment, the dye or photochromic compound can be added to first resist layer 502 after developing and freezing the first resist layer 502. The dye can also be added to the freeze agent so that resist freeze and dying of first resist layer 502 is accomplished in the same process sequence. In an embodiment, the dye or photoactive compound added to first resist layer 502 can cause photon absorption. In another example, the dye can be a photochromic material such as a spyropiran which changes its optical properties after a bleaching/flood exposure. In another embodiment, second resist layer 510 may be treated with a dye or photoactive compound, rather than the first resist layer, so as to change the optical properties of the second resist layer 510 such that the combination of first and second resist layers and alignment mark 18 is configured such that they form a grating that enhances first or higher order diffractions while substantially reducing zero$^{th}$ order diffraction and specular reflection when illuminated with the wavelength used for alignment. An advantage of treating second resist layer 510 with dye as opposed to the first resist layer 502 is that critical processes such as developing and freezing of the first resist layer 502 remain unchanged.

Figure 8:
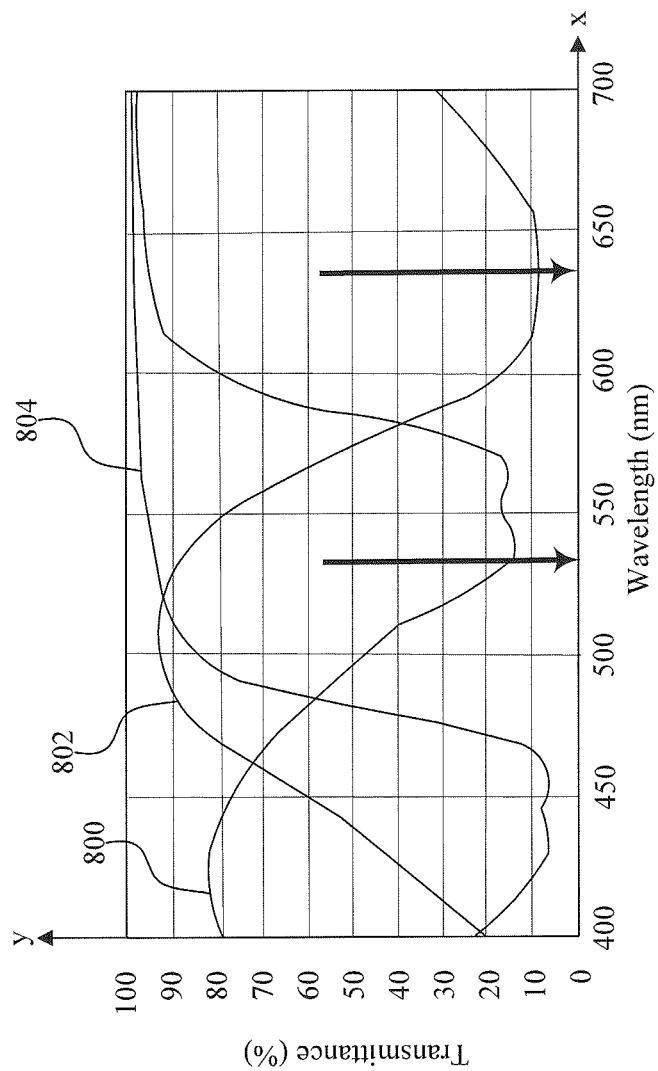
FIG. 8 illustrates shows an example transmission spectrum for conventionally dyed resists.

FIG. 8 illustrates an example transmission spectrum for conventionally dyed resists.

The Y-axis is percentage transmittance and the X-axis is wavelength in nanometers. Graph 800 illustrates transmittance percentage for magenta dyed resist, graph 802 illustrates transmittance percentage for cyan dyed resist and graph 804 illustrates transmittance percentage for yellow dyed resist.

Conventionally dyes are added to resist layers to reduce scattering effects from underlying pattern edges. In conventional cases, a dye is selected such that when a resist layer is exposed with an actinic wavelength, the dye leaves the chemical properties of the resist unaffected and only impacts the resist transparency at aligning wavelengths. As seen in graph 800, at example alignment wavelengths such as 532 nm, percentage transmittance of magenta colored resist is approximately 15%. Graph 804 illustrates percentage transmittance for yellow dye. In graph 802, at an alignment wavelength of 635 nm, the percentage transmittance of cyan colored resist is approximately 10%. Thus, most conventional dyes used to dye resist layers provide low transmittance at alignment wavelengths.

Figure 9A:
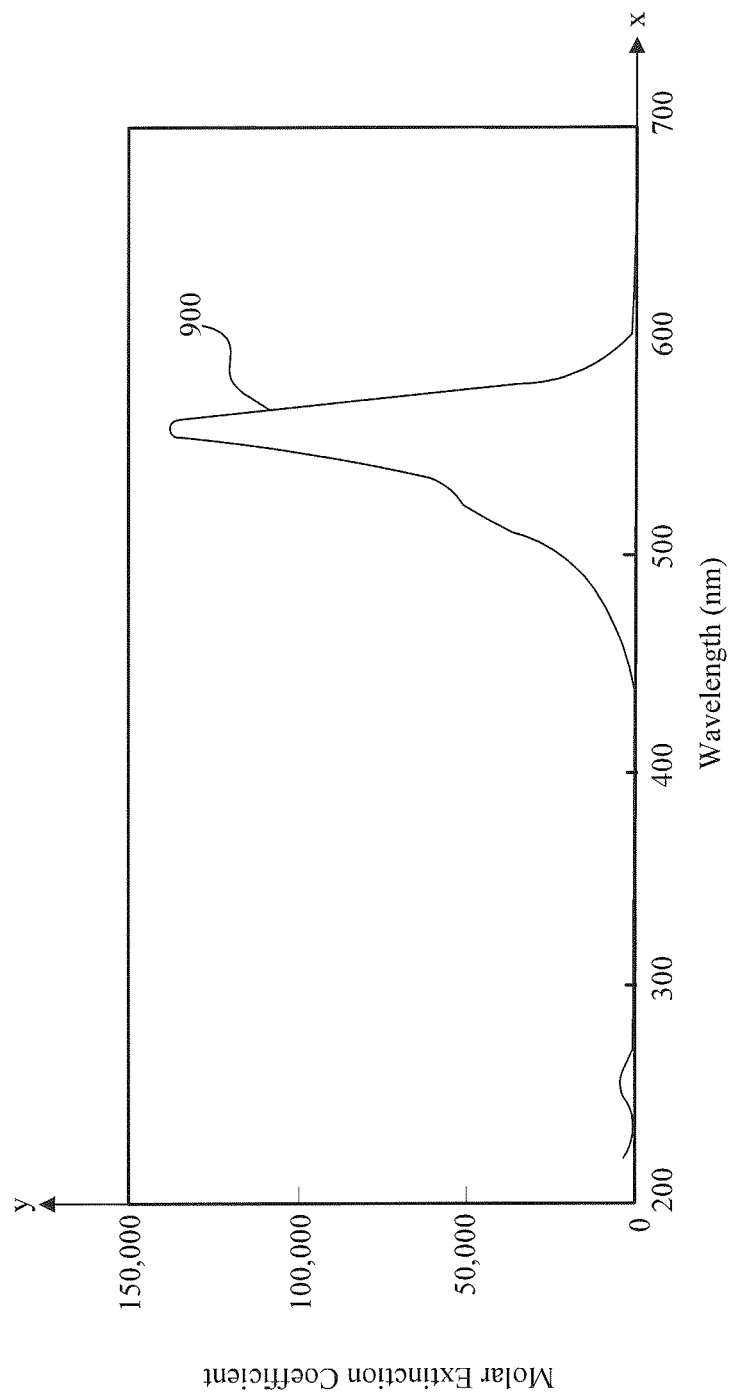
FIGS. 9A and 9B are graphs of example molar extinction coefficients for example dyes according to an embodiment of the invention.
Figure 9B:
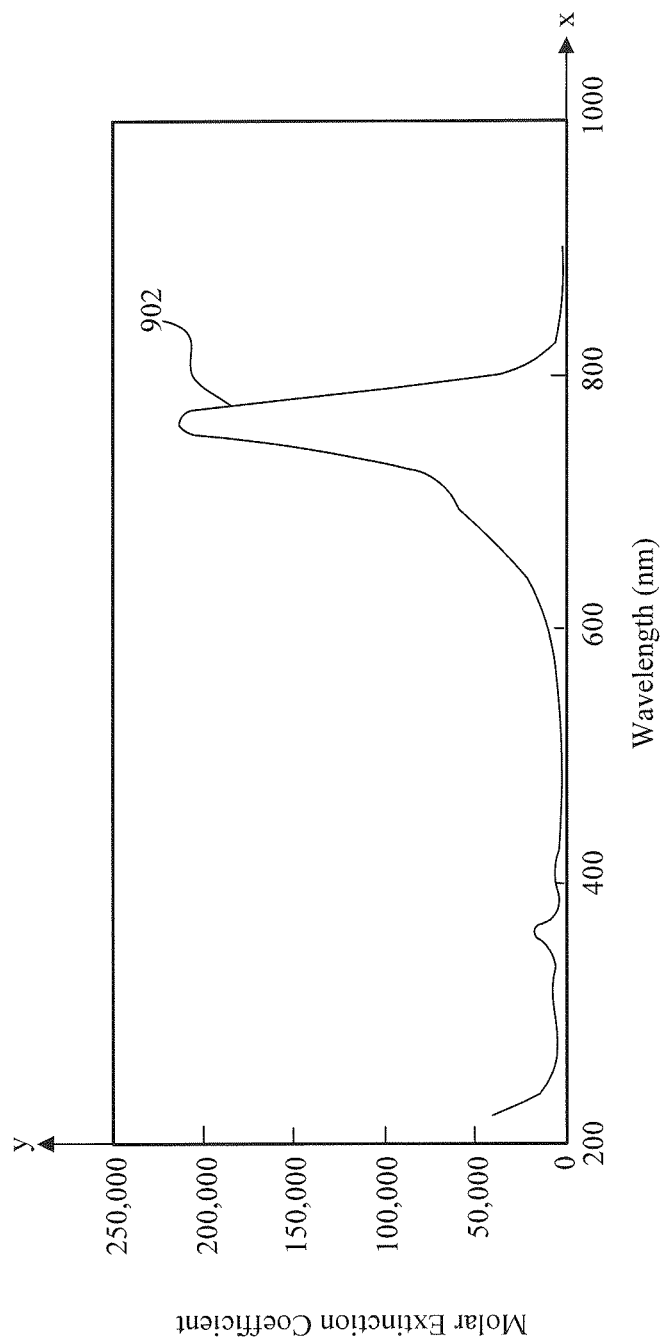

FIGS. 9A and 9B are graphs of example molar extinction coefficients for example dyes according to an embodiment of the invention. FIG. 9A illustrates graph 900 of molar coefficients for merocyanine and FIG. 9B illustrates graph 902 of molar extinction coefficients for thiatricarbocyanine according to an embodiment of the invention.

In graph 900, at an alignment wavelength of approximately 532 nm, molar extinction coefficient of merocyanine is at its peak. At an alignment wavelength of 780 nm, molar extinction coefficient of thiatricarbocyanine is at its peak. Thus merocyanine dye can be used to dye resists if an alignment wavelength of 532 nm is to be used and thiatricarbocyanine can be used to dye resists if an alignment wavelength of 780 nm is to be used. In an embodiment both dyes may be added to one or both of first resist layer 502 and second resist layer 510 so that either alignment wavelength can be used for illumination alignment marks 18. As seen in graphs 900 and graph 902, these dyes have a high molar extinction coefficient only near the alignment wavelength. Dyes with properties of being absorbing, fluorescing, or luminescing at alignment wavelengths are not limited to the two examples dyes in FIGS. 9A and 9B. Dyes can be found that support actinic exposure at, for example, 193 nm, 248 nm, 365 nm, 405 nm, and 435 nm while remaining absorbent at alignment system wavelengths. It is to be appreciated by a person of skill in the art that the type of dye can be selected based on the alignment wavelength in use and is not limited to the dyes disclosed herein.

Figure 10:
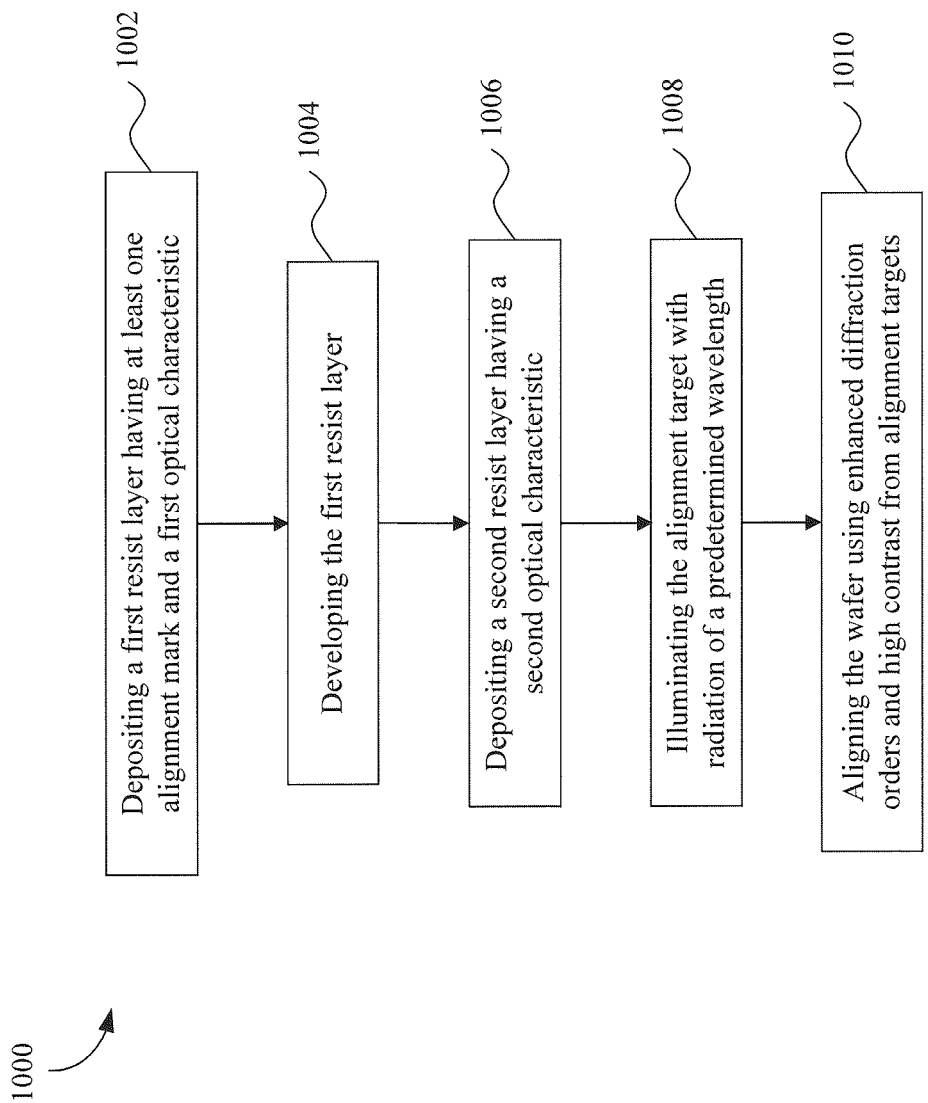
FIG. 10 is a flowchart of steps of an example process performed to generate a high contrast alignment mark and align a wafer according to an embodiment of the invention.

FIG. 10 is an example flowchart 1000 illustrating steps performed to generate a high contrast alignment mark and align a wafer according to an embodiment of the invention. Flowchart 1000 will be described with continued reference to the example operating environment depicted in FIGS. 1-9. However, flowchart 1000 is not limited to these embodiments. Note that some steps shown in flowchart 1000 do not necessarily have to occur in the order shown.

In step 1002, a first resist layer with a first optical characteristic is deposited on a wafer and patterned to include at least one alignment mark. For example, first resist layer 502 with a first optical characteristic of being absorbent, fluorescent or luminescent when illuminated with radiation of the pre-determined wavelength 13 used for alignment while being transparent when illuminated with radiation of an actinic wavelength is deposited and patterned to include at least one alignment mark 18.

In step 1004, the first resist layer is developed and freezed. For example, first resist layer 502 is developed and frozen using one of ion implantation, DUV exposure or chemical hardening.

In step 1006, a second resist layer is deposited on the first resist layer. The second resist layer has a second optical characteristic such that an alignment mark in the first resist layer is absorbent, fluorescent or luminescent when illuminated with radiation of the pre-determined wavelength used for alignment while being transparent when illuminated with radiation of an actinic wavelength through the second resist layer. For example, second resist layer 510 is deposited on first resist layer 502. In an embodiment, the second resist layer 510 may be dyed along with the first resist layer 502. In another embodiment, only the second resist layer 510 is dyed to render the second optical characteristic. In yet another embodiment, the second resist layer 510 may be un-dyed and therefore the second optical characteristic of the second resist layer 510 is the same as that of an un-dyed resist layer.

In step 1008, an alignment target in the first resist layer is illuminated with radiation of a pre-determined wavelength. For example, alignment target 18 in first resist layer 502 is illuminated with radiation of a predetermined wavelength used for alignment.

In step 1010, a wafer is aligned using high contrast radiation diffracted from an alignment target. For example, high order diffracted radiation 700 from alignment target 18 in first resist layer 502 is used to align a wafer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation.

The term "lens," where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method to align a wafer in a double patterning lithography process, comprising:
   depositing, a first resist layer having a first optical characteristic;
   forming at least one alignment mark having the first optical characteristic in the first resist layer;
   developing the first resist layer; and
   depositing a second resist layer, having a second optical characteristic, over the first resist layer, wherein combination of the first and second resist layers and the alignment mark being configured and arranged such that radiation of a pre-determined wavelength incident on the alignment mark produces a first or higher order diffraction as a function of the first and second optical characteristics.

2. The method of claim 1, further comprising infusing one or both of the first and second resist layers with a dye or a photoactive compound that absorbs, fluoresces or luminesces when illuminated with radiation of the pre-determined wavelength used for alignment.

3. The method of claim 1, further comprising infusing the first resist layer with a dye or a photoactive compound that absorbs, fluoresces or luminesces when illuminated with radiation of the pre-determined wavelength used for alignment and that is transparent when illuminated with radiation of an actinic wavelength.

4. The method of claim 1, further comprising adding a dye or a photoactive compound to the first resist layer prior to depositing the first resist layer.

5. The method of claim 1, further comprising adding a dye or a photoactive compound to the first resist layer while depositing the first resist layer.

6. The method of claim 1, further comprising adding a dye or a photoactive compound to the first resist layer after developing the first resist layer.

7. The method of claim 1, further comprising freezing the first resist layer after the developing step and adding a dye or a photoactive compound to a freeze agent used to freeze the first resist layer.

8. The method of claim 1, further comprising adding a dye or a photoactive compound to the second resist layer.

9. The method of claim 1, further comprising adding a dye or a photoactive compound to the first resist layer after patterning the first resist layer.

10. The method of claim 1, further comprising adding a first dye or photoactive compound to the first resist layer and a second dye or photoactive compound to the second resist layer so as to increase optical contrast between the first and second resist layers and to improve diffraction of radiation incident on the alignment mark in the first resist layer.

11. The method of claim 1, wherein optical characteristics of the first layer derive from a dye or photoactive compound in the first resist layer.

12. The method of claim 1, wherein the optical characteristics of the first and second resist layers derive from dyes or photoactive compounds infused in one or both of the first and second resist layers.

13. The method of claim 1, wherein at least one of the first and the second resist layer is infused with a photochromic compound.

14. The method of claim 1, wherein the first and second resist layers are infused with different photoactive compounds such that a first photoactive compound provides higher order diffraction from the alignment target at a first alignment wavelength and the a second photoactive compound provides a higher order diffract on from the alignment target at a second alignment wavelength.

15. The method of claim 1, wherein the first resist layer and/or the second resist layer is infused with one or both of Merocyanine or Thiaearbocyanine.

16. The method of claim 1, wherein the second layer is deposited over the first layer prior to an etching process.

17. The method of claim 1, wherein the alignment mark in the first resist layer and a portion of the second resist layer together form a diffraction grating.

18. The method of claim 17, wherein the combination of the first and second resist layers and the alignment mark are configured such that they form a grating that enhances first or higher order diffractions while substantially reducing zero$^{th}$ order diffraction and specular reflection when illuminated with a wavelength used for alignment.

19. An optical element, comprising:
    a first resist layer having a first optical characteristic; and
    a second resist layer deposited over the first resist layer and having a second optical characteristic;
    wherein an alignment mark formed by combination of the first and second resist layers produces a first or higher older diffraction, as a function of the first and second optical characteristics, when illuminated with a pre-determined wavelength used for alignment.

20. The optical element of claim 19, wherein one or both of the first and second resist layers is infused with a dye or a photoactive compound that absorbs, fluoresces or luminesces when illuminated with radiation of the pre-determined wavelength used for alignment.

21. The optical element of claim 19, wherein the first resist layer is infused with a dye or a photoactive compound that absorbs, fluoresces or luminesces when illuminated with radiation of the pre-determined wavelength used for alignment and that is transparent when illuminated with radiation of an actinic wavelength.

22. The optical element of claim 19, wherein the alignment mark and a portion of the second resist layer together form a diffraction grating.

23. The optical element of claim 22, wherein the combination of the first and second resist layers and the alignment mark are configured such that they form a grating that enhances first or higher order diffractions while substantially reducing zero$^{th}$ order diffraction and specular reflection when illuminated with the wavelength used for alignment.

* * * * *

UNITED STATES PATENT AND TRADEMARK OFFICE
CERTIFICATE OF CORRECTION

PATENT NO. : 8,625,096 B2  Page 1 of 1
APPLICATION NO. : 12/730906
DATED : January 7, 2014
INVENTOR(S) : Sewell et al.

It is certified that error appears in the above-identified patent and that said Letters Patent is hereby corrected as shown below:

Title page, Item [57] section, please delete "foams" and insert --forms--

In the Claims
Column 14, line 13, claim 14, delete "diffract on" and insert --diffraction--
Column 14, line 17, claim 15, delete "Thiaearbocyanine" and insert --Thiacarbocyanine--

Signed and Sealed this
Tenth Day of June, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 8,625,096 B2 | Page 1 of 1 |
| APPLICATION NO. | : 12/730906 | |
| DATED | : January 7, 2014 | |
| INVENTOR(S) | : Sewell et al. | |

It is certified that error appears in the above-identified patent and that said Letters Patent is hereby corrected as shown below:

In the Claims

Column 14, line 34, claim 19, delete "older" and insert --order--

Signed and Sealed this
Twelfth Day of August, 2014

Michelle K. Lee
*Deputy Director of the United States Patent and Trademark Office*